United States Patent [19]
Cheng

[11] Patent Number: 5,982,600
[45] Date of Patent: Nov. 9, 1999

[54] LOW-VOLTAGE TRIGGERING ELECTROSTATIC DISCHARGE PROTECTION

[75] Inventor: Wen-Bor Cheng, Tainan, Taiwan

[73] Assignee: Macronix International Co., Ltd., Hsinchu, Taiwan

[21] Appl. No.: 09/062,865

[22] Filed: Apr. 20, 1998

[51] Int. Cl.[6] .................................................. H02H 3/22
[52] U.S. Cl. ............................ 361/111; 361/56; 257/355
[58] Field of Search ............................... 361/56, 91, 111; 257/355–363

[56] References Cited

U.S. PATENT DOCUMENTS

| | | | |
|---|---|---|---|
| 4,937,639 | 6/1990 | Yao et al. ................................ | 257/360 |
| 5,239,440 | 8/1993 | Merrill ..................................... | 361/91 |
| 5,246,872 | 9/1993 | Mortensen ............................... | 437/51 |
| 5,262,344 | 11/1993 | Mistry ..................................... | 437/57 |
| 5,270,565 | 12/1993 | Lee et al. ................................ | 257/358 |
| 5,276,350 | 1/1994 | Merrill et al. .......................... | 257/603 |
| 5,301,084 | 4/1994 | Miller ..................................... | 361/91 |
| 5,559,352 | 9/1996 | Hsue et al. ............................. | 257/328 |
| 5,635,746 | 6/1997 | Kimura et al. ......................... | 257/382 |
| 5,701,024 | 12/1997 | Watt ....................................... | 257/360 |
| 5,710,452 | 1/1998 | Narita ..................................... | 257/355 |
| 5,717,559 | 2/1998 | Narita ..................................... | 361/56 |

OTHER PUBLICATIONS

Amerasekera, A. et al., "The Impact of Technology Scaling on ESD Robustness and Protection Circuit Design", *EOS/ESDosium Proceedings*, Las Vegas, NV, Sep. 1994, pp. 6.1.1–6.1.9.

Chatterjee, A. et al., "A Low–Voltage Triggering SCR for On–Chip ESD Protection at Output and Input Pads", *IEEE Electron Device Letters*, vol. 12, No. 1, Jan. 1991, pp. 21–22.

Duvvury, C. et al., "Internal Chip ESD Phenomena Beyond the Protection Circuit", *IEEE Transactions on Electron Devices*, vol. 35, No. 12, Dec. 1988, pp. 2133–2139.

Johnson, C. et al., "Two Unusual HBM ESD Failure Mechanisms on a Mature CMOS Process", *EOS/ESD Symposium Proceedings*, Lake Buena Vista, FL, Sep. 1993, pp. 5B.4.1–5B.4.7.

Duvvury, C. et al., "ESD Protection Reliability in $1\mu$M CMOS Technologies", IEEE 24th Annual Proceedings, Reliability Physics 1986, Anaheim, CA, Apr. 1986, pp. 199–205.

Duvvury, C. et al., "Achieving Uniform nMOS Device Power Distribution for Sub–micron ESD Reliability", IEEE, New York, 1992, pp. 6.1.1–6.1.4. (No Month).

Duvvury, C. et al., "Dynamic Gate Coupling of NMOS For Efficient Output ESD Protection", IEEE 30th Annual Proceedings, Reliability Physics 1992, San Diego, CA Mar. 1992, pp. 141–150.

Polgreen, T. et al., "Improving the ESD Failure Threshold of Silicided n–MOS Output Transistors by Ensuring Uniform Current Flow", *IEEE Transactions on Electron Devices*, vol. 39, No. 2, Feb. 1992, pp. 379–388.

*Primary Examiner*—Michael J. Sherry
*Attorney, Agent, or Firm*—Mark A. Haynes; Haynes & Beffel LLP

[57] ABSTRACT

Systems and methods are described for providing low-voltage triggering electrostatic discharge (ESD) protection in the context of integrated circuits. A low-voltage triggering electrostatic discharge protection circuit has a low trigger voltage and can turn on quickly to provide a low resistance path. The protection circuit can be employed in power bus, input, and input/output pin ESD protection configurations. This protection circuit is compatible with complementary metal oxide semiconductor (CMOS) processes. High ESD performance can even be achieved with devices fabricated in accordance with advanced CMOS processes.

51 Claims, 8 Drawing Sheets

LOW-VOLTAGE TRIGGERING ELECTROSTATIC DISCHARGE PROTECTION

BACKGROUND OF THE INVENTION

1. Field of the Invention

The invention relates generally to the field of electrostatic discharge (ESD) protection of semiconductor circuits. More particularly, in one embodiment, the invention relates to a low-voltage triggering (LT) N-channel metal oxide semiconductor (NMOS) that can turn on rapidly during an ESD event and provide a lower resistance, substantially uniform current density path for an ESD current, thereby effectively shunting substantially all of an ESD pulse.

2. Discussion of the Related Art

Prior art electrostatic discharge protection devices are known to those skilled in the art. For example, a conventional approach to providing electrostatic discharge protection is to provide a circuit with a device that can intervene to deflect a potentially dangerous electrostatic discharge towards ground, and away from the remaining components of the circuit, during an electrostatic discharge event.

One way to provide ESD protection is to use a thick field device. For example, referring to FIG. 1, a conventional thick field device (TFD) is shown where an N+doped source 110 and an N+doped drain 120 are located within a P doped well 130. Isolation oxides 140 are located next to the N+doped source 110 and the N+doped drain 120 at the top of the P doped well 130. There is no gate in the TFD illustrated in FIG. 1, and this TFD simply turns on by avalanche breakdown across the drain/channel junction. The TFD shown in FIG. 1 is a conventional approach to providing Vdd/Vss ESD protection.

Figure 2:
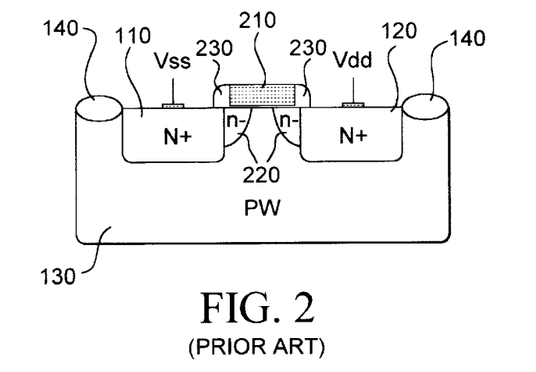
FIG. 2 illustrates a schematic view of a conventional lightly doped drain N-channel metal oxide semiconductor device for Vdd/Vss electrostatic discharge protection, appropriately labeled prior art.

Another way to provide ESD protection is to use a grounded gate thin oxide NMOS. For instance, referring to FIG. 2, a grounded gate thin oxide NMOS (GGNMOS) is shown where the N+doped source 110 and the N+doped drain 120 are located within the P doped well 130. A gate 210 is located above and between the N+doped source 110 and the N+doped drain 120. Two n−doped regions 220 are located beneath the gate 210. A first of the two n−doped regions 220 is located adjacent the N+doped source 110 and a second of the two n−doped regions 220 is located adjacent the N+doped drain 120. Two spacers 230 are located next to the gate 210. Isolation oxides 140 are located next to the N+doped source 110 and the N+doped drain 120 at the top of the P doped well 130. The device shown in FIG. 2 is a conventional LDD NMOS, with n−implantation, approach to providing Vdd/Vss ESD protection. Unfortunately, even the trigger voltage of the LDD NMOS device shown in FIG. 2 is not low enough to protect many types of circuitry from damage.

Figure 1:
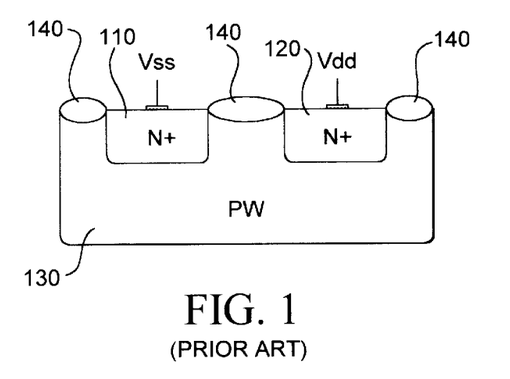
FIG. 1 illustrates a schematic view of a conventional thick field device for Vdd/Vss electrostatic discharge protection, appropriately labeled prior art.
Figure 3:
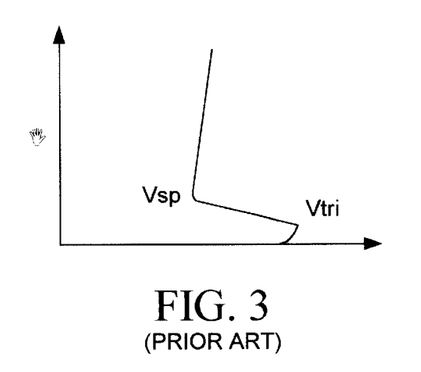
FIG. 3 illustrates a schematic representation of the snap back I-V characteristics of the device shown in FIG. 2.

Thus, two ways to provide Vdd vs. Vss power bus protection are represented by the thick field device (TFD) shown in FIG. 1 and the grounded gate thin oxide NMOS (GGNMOS) shown in FIG. 2. Both of these protection devices operate as NPN bipolar devices during an ESD event. The I-V characteristic of these NPN bipolar devices is represented in FIG. 3. More specifically, trace shown in FIG. 3 represents the snapback I-V characteristics of the GGNMOS illustrated in FIG. 2. Referring to FIG. 3, when the voltage reaches a trigger voltage (Vtri), the NPN device turns on and enters into snapback region of low impedance (Vsp) so as to permit the dissipation of high amounts of ESD energy.

An ESD protection device (e.g., a power bus protection device) with a lower (Vtri) can effectively turn on more quickly (first) to protect internal circuitry from damage. Further, an ESD protection device with a lower snapback voltage (Vsp) can dissipate higher current and achieve a higher ESD threshold. A good ESD protection circuit must have both i) a lower trigger voltage (Vtri) and ii) a lower snapback voltage (Vsp).

However, the ESD protection performance available using these prior art approaches has degraded in association with advanced processes, such as, for example, lightly doped drain (LDD) devices, the use of thinner oxide layers, and the salicide process, etc. As these, and other, advanced processes evolve, more and more ESD damage is occurring in sub-micron integrated circuits during ESD pulse stress despite the use of the TFD and GGNMOS approaches.

The conventional TFD and GGNMOS approaches are not a good way to provide power bus ESD protection in the context of advanced processes, such as, for example, the above-mentioned lightly doped drain (LDD) devices, thinner oxide layers, and salicide process, etc. Specifically, the higher trigger voltage levels that are inherent to the conventional TFD and GGNMOS approaches cannot protect weaker circuits against ESD damage.

In particular, a drawback of using the conventional LDD device shown in FIG. 2 is that such devices are very weak during ESD stress. In more detail, the LDD n-region induces non-uniform current distribution and local hot spots. As device sizes shrink into the sub-micron regime and beyond, these hots spots become more problematic. Therefore, the LDD NMOS device shown in FIG. 2 cannot, by itself, act as a good ESD protection circuit.

Figure 4:
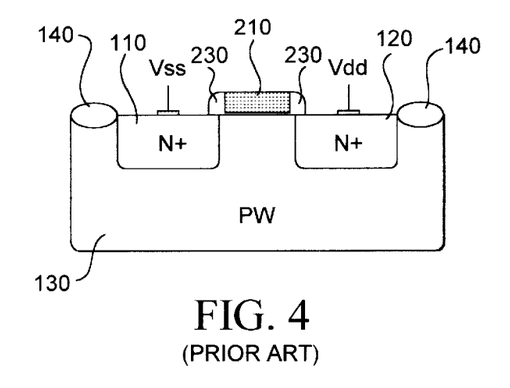
FIG. 4 illustrates a schematic view of a conventional non lightly doped drain N-channel metal oxide semiconductor device (without n-implantation) for Vdd/Vss electrostatic discharge protection, appropriately labeled prior art.

One unsatisfactory approach, in an attempt to solve the above-discussed problem of nonuniform current distribution involves using a non-lightly doped drain (non-LDD) device. A non-LDD NMOS device is shown in FIG. 4. Referring to FIG. 4, again the N+doped source 110 and the N+doped drain 120 are located within the P doped well 130. The gate 210 is again located above and between the N+doped source 110 and the N+doped drain 120 and two spacers 230 are located next to the gate 210. Isolation oxides 140 are again located next to the N+doped source 110 and the N+doped drain 120 at the top of the P doped well 130. The difference between the structures shown in FIG. 2 and FIG. 4 is that the device shown in FIG. 4 has no n−doped regions. The absence of any n−doped regions obviates the hot spot problems inherent to the device shown in FIG. 2. The purpose of using such a non-LDD device was to improve the current distribution (compared to the device shown in FIG. 2), by making the current distribution more uniform. In the absence of n−doped regions, this limited purpose is achieved by the device shown in FIG. 4.

Unfortunately, the trigger voltage of the non-LDD device shown in FIG. 4 is not low enough to protect many types of circuitry from damage. The use of device shown in FIG. 4 in association with circuitry that is based on advanced processes, such as, for example, the above-mentioned lightly doped drain (LDD) devices, the use of thinner oxide layers, and the salicide process, etc., often results in damage from ESD stress due to the trigger voltage (Vtri) being inappropriately high.

Thus, one requirement of this technology has been that an ESD protection approach should be capable of switching on very quickly to protect the balance of the integrated circuit. Therefore, what is required is solution that has a low triggering voltage (Vtri), so as to exhibit a quick reaction time.

Another requirement of this technology has been that an ESD protection approach should be capable of conducting substantially all of an ESD pulse. Thus, what is also required is a solution that has a low snapback voltage (Vsp), so as to exhibit the ability to shunt substantially all of an ESD pulse.

Another requirement of this technology has been that such an ESD protection approach should be capable of conducting substantially all of an ESD pulse without developing any hot spots. Thus, what is also required is solution that has a uniform current distribution, so as to exhibit the ability to shunt substantially all of an ESD pulse.

Another requirement of this technology has been that such an ESD protection approach should be economical to implement. A disadvantage of the previous approaches represented in FIGS. 1–4 has been relatively high cost. Thus, what is also required is a solution that meets the above-discussed requirements in a more cost effective manner.

Therefore, what is needed to improve ESD protection performance is a low-voltage triggering protection approach that combines a low triggering voltage (Vtri) with a low snapback voltage (Vsp) and uniform current distribution, and is economical to fabricate in the context of a salicide integrated circuit. Heretofore, the requirements of low triggering voltage (Vtri), low snapback voltage (Vsp), uniform current distribution, and low cost referred to above have not been fully met. What is needed is a solution that simultaneously addresses all of these requirements.

SUMMARY OF THE INVENTION

A primary object of the invention is to provide an electrostatic discharge protection device. Another primary object of the invention is to provide a method of making the electrostatic discharge device. Another primary object of the invention is to provide a method of operating an electrostatic discharge protection device.

In accordance with these objects, there is a particular need for a low-voltage triggering (LT) N-channel metal oxide semiconductor (NMOS), a method of fabrication thereof, and a method of operation thereof. Thus, it is rendered possible to simultaneously satisfy the above-discussed requirements of a low triggering voltage (Vtri), a low snapback voltage (Vsp), uniform current distribution, and economical implementation, which, in the case of the prior art, are mutually contradicting and cannot be simultaneously satisfied.

A first aspect of the invention is implemented in an embodiment that is based on an electrostatic discharge protection circuit for protected terminals on an integrated circuit substrate, the integrated circuit substrate having a first conductivity type, the electrostatic discharge protection circuit comprising: a source located in the integrated circuit substrate, the source having a second conductivity type; a drain located in the integrated circuit substrate, the drain having the second conductivity type; a channel located between the source and the drain; a first lightly doped region located in the channel and between the source and the drain, the first lightly doped region having the first conductivity type; a first electrical contact on the source; and a second electrical contact on the drain, wherein the first electrical contact and the second electrical contact are coupled to protected terminals on the integrated circuit substrate.

A second aspect of the invention is implemented in an embodiment that is based on a method of making an integrated circuit electrostatic discharge protection circuit on a semiconductor substrate having a first conductivity type and a first dopant concentration level, the method comprising: forming a gate on the semiconductor substrate; forming a first doped region of the first conductivity type in the semiconductor substrate and a second doped region of the first conductivity type in the semiconductor substrate, the first doped region and the second doped region being located proximate the gate and being spaced away from one another by a channel region in the semiconductor substrate, the channel region being located under the gate; and forming a third doped region of a second conductivity type in the first doped region and a fourth doped region of the second conductivity type in the second doped region, the third doped region and the fourth doped region being spaced away from one another by a distance that is greater than the distance between the first doped region and the second doped region], wherein the doping concentration level of both the first doped region and the second doped region is greater than the doping concentration level of the semiconductor substrate.

A third aspect of the invention is implemented in an embodiment that is based on a method of providing an integrated circuit on a substrate with electrostatic discharge protection, the substrate having a first conductivity type and a first doping concentration level, the method comprising: conducting an electrostatic discharge pulse to a drain of an electrostatic discharge protection device that is provided in a nonconductive state; and switching the electrostatic discharge protection device to a conductive state so as to provide a lower resistance, substantially uniform current density path for an electrostatic discharge current, thereby shunting substantially all of the electrostatic discharge pulse, wherein switching includes routing the electrostatic discharge pulse through a first region of a second conductivity type, then routing the electrostatic discharge pulse through a second region of the first conductivity type, the second region having a doping concentration level that is higher than the first doping concentration level, and then routing the electrostatic discharge pulse through a third region of the second conductivity type.

These, and other, objects and aspects of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF THE DRAWINGS

A clear conception of the advantages and features constituting the invention, and of the components and operation of model systems provided with the invention, will become more readily apparent by referring to the exemplary, and therefore nonlimiting, embodiments illustrated in the drawings accompanying and forming a part of this specification, wherein like reference characters (if they occur in more than one view) designate the same parts. It should be noted that the features illustrated in the drawings are not necessarily drawn to scale.

DESCRIPTION OF PREFERRED EMBODIMENTS

The invention and the various features and advantageous details thereof are explained more fully with reference to the nonlimiting embodiments that are illustrated in the accompanying drawings and detailed in the following description. Descriptions of well known components and processing techniques are omitted so as not to unnecessarily obscure the invention in detail.

The context of the invention is electrostatic discharge (ESD) protection within an integrated circuit. In particular, the invention may be used in the context of an integrated circuit that includes N-channel metal oxide semiconductors.

The inventor of this application has discovered that as advanced fabrication processes, such as, for example, lightly doped drain (LDD) devices, the use of thinner oxide layers, and the salicide process, etc. evolve, more and more ESD damage is occurring in sub-micron integrated circuits during ESD pulse stress. Significantly, after detailed failure analysis, the inventor of this application has unexpectedly discovered that, in such sub-micron integrated circuits, the failure locations are usually found at internal circuit locations. For example, the continued use of prior art ESD devices, such as shown in FIG. 4, in association with circuitry that is based on the above-mentioned advanced processes results in stand-by current or function failure after ESD pulse stress.

Protection Device

Figure 8:
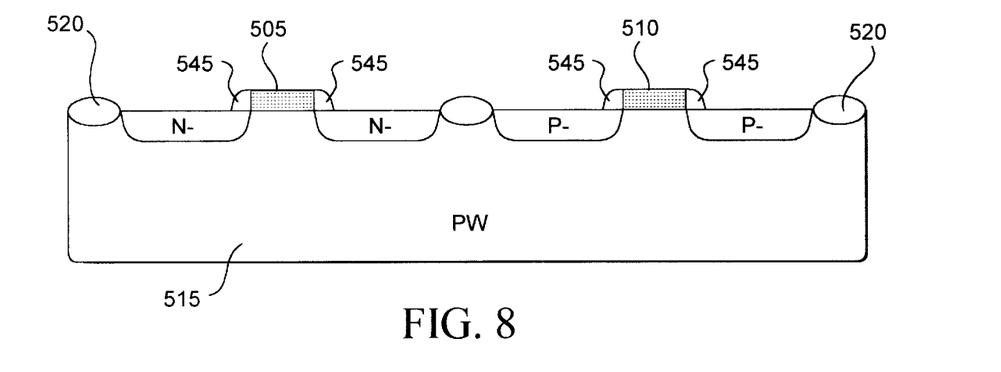
FIG. 8 illustrates a schematic view of a fourth stage in fabricating a lightly doped drain N-channel metal oxide semiconductor device adjacent to a low-voltage triggering N-channel metal oxide semiconductor, representing an embodiment of the invention.
Figure 9:
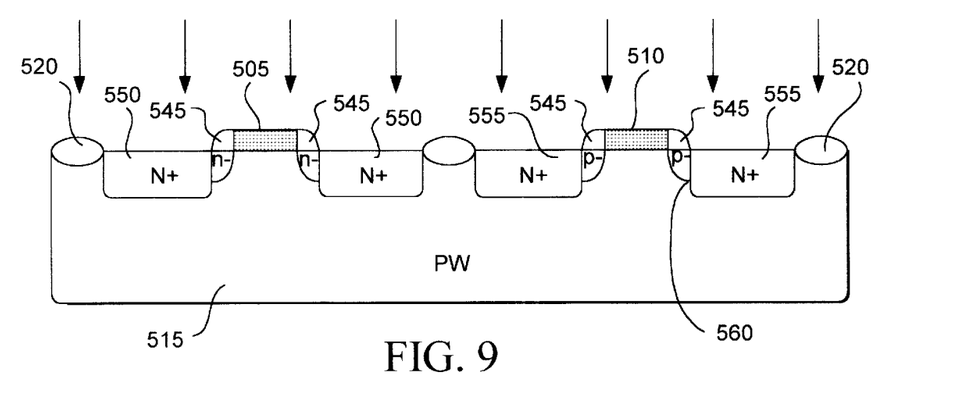
FIG. 9 illustrates schematic view of a fifth stage in fabricating a lightly doped drain N-channel metal oxide semiconductor device adjacent to a low-voltage triggering N-channel metal oxide semiconductor, representing an embodiment of the invention.
Figure 10:
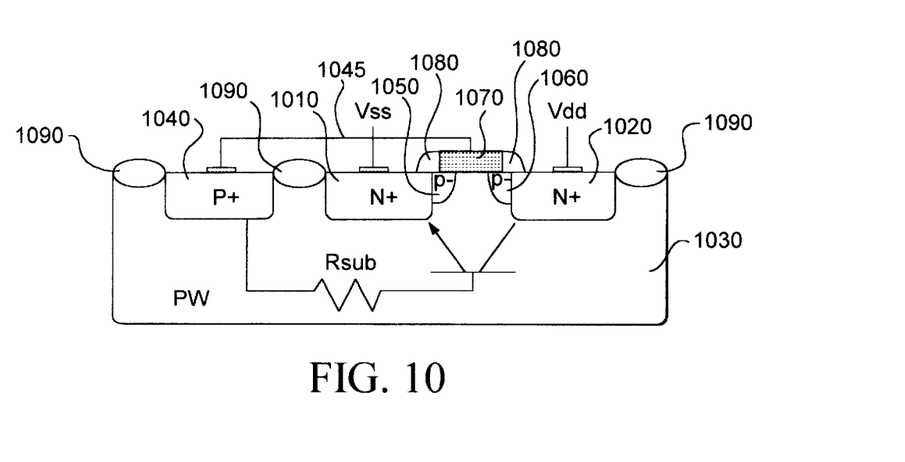
FIG. 10 illustrates a schematic view of a low-voltage triggering N channel metal oxide semiconductor with enhanced drain-gate field, representing an embodiment of the invention.

Referring to the drawings, a detailed description of preferred embodiments of the invention is provided with respect to FIGS. 5–14. Referring now to FIG. 10, a low-voltage triggering N channel metal oxide semiconductor with enhanced drain-gate field is shown where an N+doped source 1010 and an N+doped drain 1020 are located within a P doped well 1030. A P+doped region 1040 is also located within the P doped well 1030. A first p–doped region 1050 is located adjacent the N+doped source 1010. A second p–doped region 1060 is located adjacent the N+doped drain 1020. A gate 1070 is located above and between the N+doped source 1010 and the N+doped drain 1020. Thus, the two p–doped regions 1050–1060 are located beneath the gate 1070. The gate 1070 is electronically connected to the P+doped region 1040 with a conductor 1045. Two spacers 1080 are located next to the gate 1070. Isolation oxides 1090 are located next to the P+doped source and drain, and between the P+doped source 1010 and the P+doped region 1040.

In FIG. 10, the P+doped region 1040 is a pick-up diffusion of the P–well 1030 for electrical connection to Vss (ground). The p doped well 1030 can be abbreviated as PW 1030. The voltage level of the PW 1030 is through P+diffusion region 1040 connected to Vss metal line 1045. The P+doped region 1040 in FIG. 10 clearly discloses the parasitic NPN bipolar elements formed in the resulting LTNMOS device structure. The gate of the LTNMOS in FIG. 10 is connected to Vss (i.e., to ground).

Of course, the presence of the p–doped regions 1050–1060 reduces the triggering voltage compared to a situation in which there is no such regions. The result of the presence of the p–doped regions 1050–1060 is a lower triggering voltage than in the case of the device shown in FIG. 4. The level of p–doping can be adjusted to effect the triggering voltage. However, if the level of p–doping is excessively low, the triggering voltage will be unduly high, and the resulting device may not trigger quickly enough. On the other hand, if the level of p–doping is excessively high, the triggering voltage may be unduly low, and the device may trigger inappropriately, or even all the time.

It should be noted that the functional resistance of the P–doped well is represented in FIG. 10 with a schematic resistor symbol labeled Rsub for improved clarity. Similarly, the diode function of the channel is represented in FIG. 10 with a serial diode symbol for improved clarity. It can be appreciated that the low-voltage triggering N channel metal oxide semiconductor of FIG. 10 will work without the conductor 1045, albeit without the enhanced drain-gate field.

FIG. 10 shows a LTNMOS as can be used as Vdd/Vss protection device with a grounded gate. The LTNMOS operates as a bipolar NPN T1 device during ESD pulse, so it can get higher ESD performance than a low reverse breakdown diode. The trigger voltage of the LTNMOS is dependent on the p-concentration, the N+concentration, and the electrical field between the drain 1020 and the gate 1070. The LTNMOS with enhanced drain-gate field can further reduce the breakdown voltage, less than diode D1. The LTNMOS with enhanced drain-gate field can achieve lower Vtri and Vsp than the non-LDD and LDD devices shown in FIGS. 4 and 2, respectively. For example, the trigger voltages of non-LDD NMOS and LTNMOS are 11.7v and 9.4v, respectively. The LTNMOS Vsp of about 6.0v is lower than non-LDD Vsp which is about 7.0v. Therefore, the LTNMOS can turn on first to prevent internal circuits from damage, and thereby achieve higher ESD performance. As noted above, failure of internal circuits was usually found when the non-LDD devices were employed as the chip ESD protection.

Although the preferred embodiment shown in FIG. 10 is based on the use of P doped well, N+doped source, N+doped drain, and p-doped channel regions, it is within the level of ordinary skill in the art after having knowledge of the invention disclosed herein to implement the invention in an N doped well with a P+doped source and a P+doped drain via the use of n-doped channel regions. Similar modifications are within the level of ordinary skill.

The protection device with parasitic NPN bipolar operates at a snapback region after NPN turn-on, and the snapback voltage Vsp is lower than those of the previously discussed TFD and GGNMOS. As a result, the invention can achieve high ESD performance. Another embodiment of invention uses enhanced P-channel implant (cell implant) which is compatible with non-volatile memory (NVM) processes, instead of the LDD p-implant illustrated in FIG. 10, to reduce trigger voltage.

Figure 13:
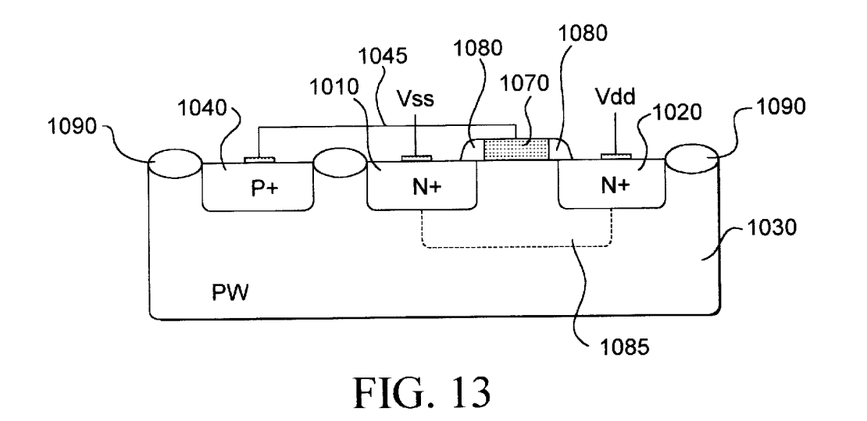
FIG. 13 illustrates a schematic view of a low-voltage triggering N channel metal oxide semiconductor with enhanced P-channel implant, representing an embodiment of the invention.

Referring now to FIG. 13, the other embodiment of the LTNMOS device includes an enhanced p-channel implant 1085 which is compatible with memory p-cell implant of nonvolatile memory (NVM) processes, instead of the p-quasi-LDD implant, to lower the trigger voltage (Vtri). If the p-dopant is boron, the preferred boron p-channel implant dose for the enhanced p-channel implant 1085 is from approximately $1(10)^{13}$ to approximately $2(10)^{13}$ ions/cm$^2$, if the enhanced p-channel implant 1085 is formed before gate oxide growth and no need of extra thermal cycle. In this way, the enhanced p-channel implant 1085 is formed as part of the low-voltage triggering N-channel metal oxide semiconductor (LTNMOS) protection device.

Method of Making the Protection Device

A method of simultaneously making a low-voltage triggering NMOS ESD device and a normal lightly doped drain (LDD) NMOS device will now be described. FIGS. 5–9 illustrate a series of fabrication steps for making low-voltage triggering NMOS (LTNMOS) next to an LDD NMOS in accordance with one embodiment of the invention. It can be appreciated from the following description of the fabrication steps that the LTNMOS device, and the protection afforded thereby, is compatible with CMOS processes in general and the LDD NMOS salicide process in particular.

Figure 5:
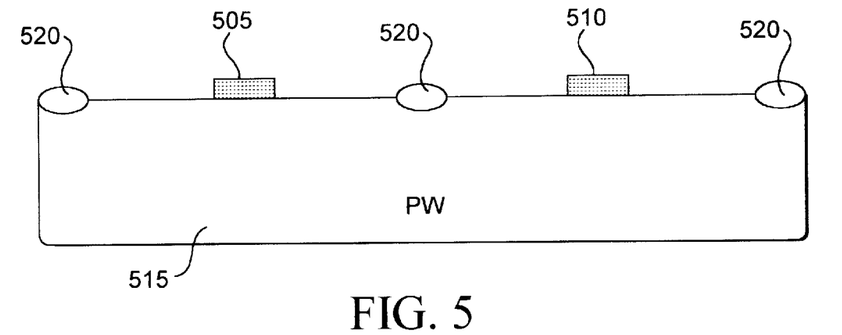
FIG. 5 illustrates a schematic view of a first stage in fabricating a lightly doped drain N-channel metal oxide semiconductor device adjacent to a low-voltage triggering N-channel metal oxide semiconductor, representing an embodiment of the invention.

FIG. 5 shows the completion of a first step in fabricating an LDD NMOS adjacent a LTNMOS protection device after poly gate etching. The LDD NMOS will be completed on the left and the LTNMOS will be completed on the right. The LDD NMOS gate 505 and the LTNMOS gate 510 are located on top of a p doped substrate 515. A series of isolation oxides 520 are also located on top of the substrate 515. The minimum design rule of poly gate length can be used for the LTNMOS.

Figure 6:
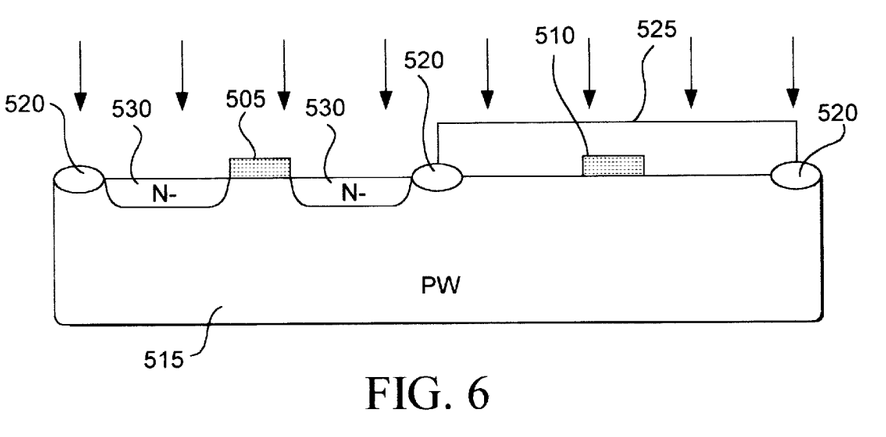
FIG. 6 illustrates a schematic view of a second stage in fabricating a lightly doped drain N-channel metal oxide semiconductor device adjacent to a low-voltage triggering N-channel metal oxide semiconductor, representing an embodiment of the invention.

FIG. 6 shows a second step wherein portions of the surface that are not masked are exposed to a LDD N-implantation procedure. The LDD n-ions are represented by the parallel downward pointing arrows in FIG. 6. An n-implant photoresist mask 525 is located on top of the LTNMOS gate 510 and portions of some of the isolation oxides 520. If phosphorous is used as the n-dopant, the LDD NMOS device needs to have a LDD phosphorus n-implant dose of from approximately $1(10)^{13}$ to approximately $3(10)^{13}$ ions/cm$^2$. In this way, two n-regions 530 are formed as part of the LDD NMOS device. However, the LTNMOS protection device on the right is not subject to n-implantation because it is blocked by the n-implant photoresist mask 525, as shown in FIG. 6. This provides an abrupt junction. Thus, FIG. 6 illustrates a lightly doped drain n-implant for the NMOS, but no n-implant for LTNMOS protection device.

Figure 7:
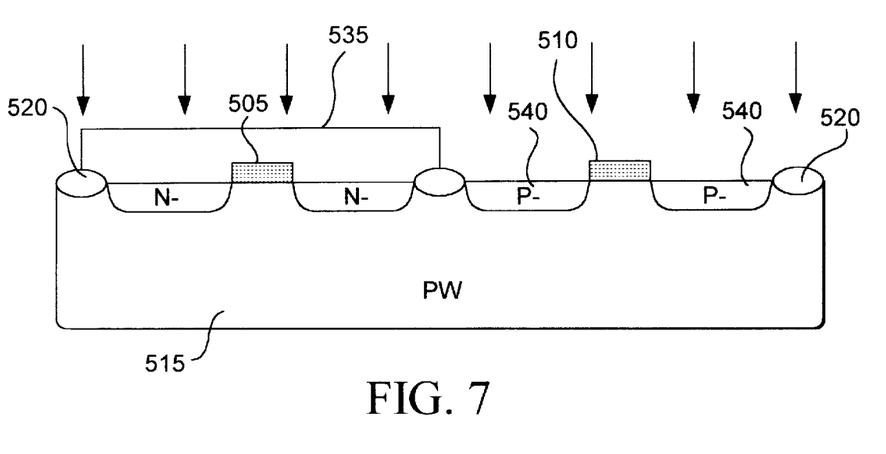
FIG. 7 illustrates a schematic view of a third stage in fabricating a lightly doped drain N-channel metal oxide semiconductor device adjacent to a low-voltage triggering N-channel metal oxide semiconductor, representing an embodiment of the invention.

FIG. 7 shows a third step wherein portions of the surface that are not masked are exposed to a LDD p-implantation procedure. The LDD p-ions are represented by the parallel downward pointing arrows in FIG. 7. A p-implant photoresist mask 535 is located on top of the LDD NMOS gate 505 and portions of some of the isolation oxides 520. Two p-regions 540 are formed as part of the LTNMOS protection device. Thus, FIG. 7 illustrates quasi-LDD p-implant for the LTNMOS protection device, but no p-implant for LDD NMOS. If boron is used as the p-dopant, the LTNMOS device needs to have a boron p-implant dose of from approximately $1(10)^{13}$ to approximately $2(10)^{13}$ ions/cm$^2$, as in forming p-regions for LDD PMOS in CMOS processes. This means that the process of forming the LTNMOS protection device is very compatible with forming LDD PMOS devices elsewhere on the same substrate. At the same time such LDD PMOS devices are optionally being formed, the LDD p-implant is also formed in LTNMOS protection device with the ultimate goal being to get a lower trigger voltage (Vtri) from the protection device. A major difference between LTNMOS and LDD NMOS is that a normal LDD NMOS is does not undergo any LDD p-implant.

FIG. 8 shows the completion of a fourth step wherein spacer regions 545 have been formed adjacent both sides of gate 505 and gate 515. The spacer regions are defined as in the well known LDD process. Thus, FIG. 8 illustrates the LDD NMOS and LTNMOS after spacer etching.

FIG. 9 shows a fifth step wherein the surface is exposed to a N+implantation procedure that is common to both the drain and source sides of both the LDD NMOS and LTNMOS subcomponents. The N+ions are represented by the parallel downward pointing arrows in FIG. 9. Two N+regions 550 are formed as part of the LDD NMOS protection device. Similarly, two N+regions 555 are formed as part of the LTNMOS protection device. Thus, FIG. 9 illustrates N+source/drain (S/D) implant for both the LDD NMOS and LTNMOS devices. In general, the preferred N+implant is arsenic with dose of from approximately $1(10)^{15}$ to approximately $4(10)^{15}$ ions/cm$^2$, The LDD P-region of the LTNMOS protection device is self aligned by poly gate and spacer. The protection device has novel diodes D1 with lower breakdown voltages formed by abrupt N+junctions and self-aligned P-regions.

Still referring to FIG. 9, the resulting LTNMOS provides a low-voltage triggering protection to improve ESD performance. This ESD protection device is advantageously employed as a Vdd/Vss power bus protection device to avoid internal circuit failure. The trigger voltage Vtri of the invention is low enough to turn on first to dissipate ESD current and prevent internal circuits from breakdown. The ESD protection circuit is compatible with existing CMOS processes. The ESD protection circuit is formed by non-LDD NMOS device and lightly doped P-region (LDD P-implant for PMOS device in CMOS processes). A diode 560 with low breakdown voltage can obtained by abrupt N+junction and LDD P-region. The electrical field between drain and gate in this protection device will further lower trigger voltage. Therefore, the protection device of invention has a lower trigger voltage and no current non-uniform issue of the LDD device.

The invention can be applied to input, output, and I/O protections to get high ESD performance. The invention can improve ESD performance to avoid advanced process induced ESD degradation. This invention is specially employed in Vdd/Vss power bus ESD protection. Due to the low threshold, the low-voltage triggering protection can turn on first to dissipate ESD current and prevent internal circuits from breakdown.

While not being limited to any particular performance indicator or diagnostic identifier, preferred embodiments of the invention can be identified one at a time by testing for the presence of a low triggering voltage (Vtri) and a low snap-back voltage (Vsp). The test for the presence of a low triggering voltage can be carried out without undue experimentation through the use of a capacitor. The test for the presence of a low snap back voltage can be carried out without undue experimentation with the addition of an oscilloscope.

Some NPN I-V characteristics of non-LDD NMOS devices and the LTNMOS protection device are depicted in FIGS. 15–18. All four of these I-V curves were measured by an Hewlett-Packard HP4156 semiconuctor parameter analyzer and are DC characteristics. The major focus is on the trigger voltage and the snapback region. The region between Vtri and Vsp point is an unstable condition.

Figure 15:
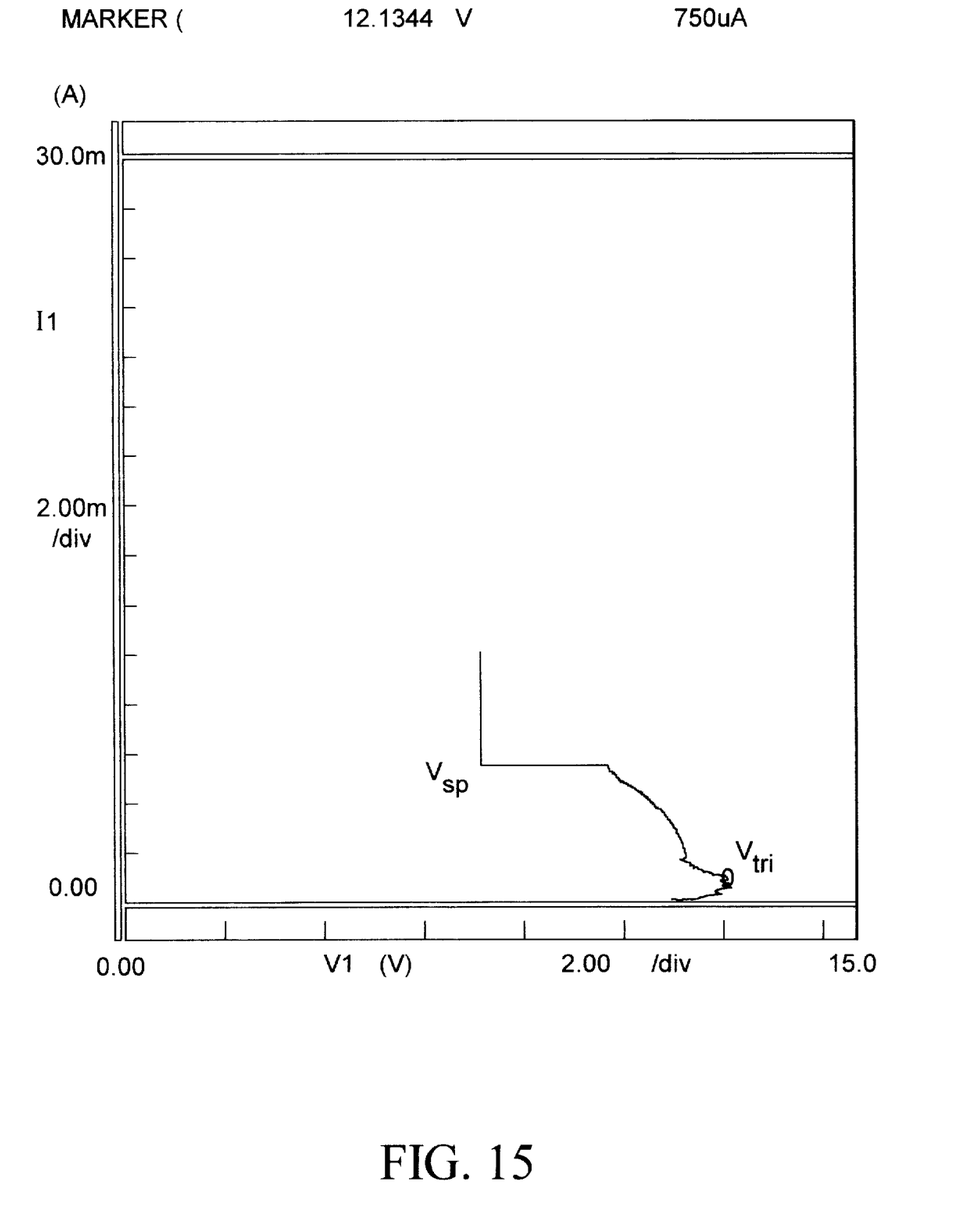
FIG. 15 illustrates the NPN trigger voltage of a non-LDD NMOS device.
Figure 16:
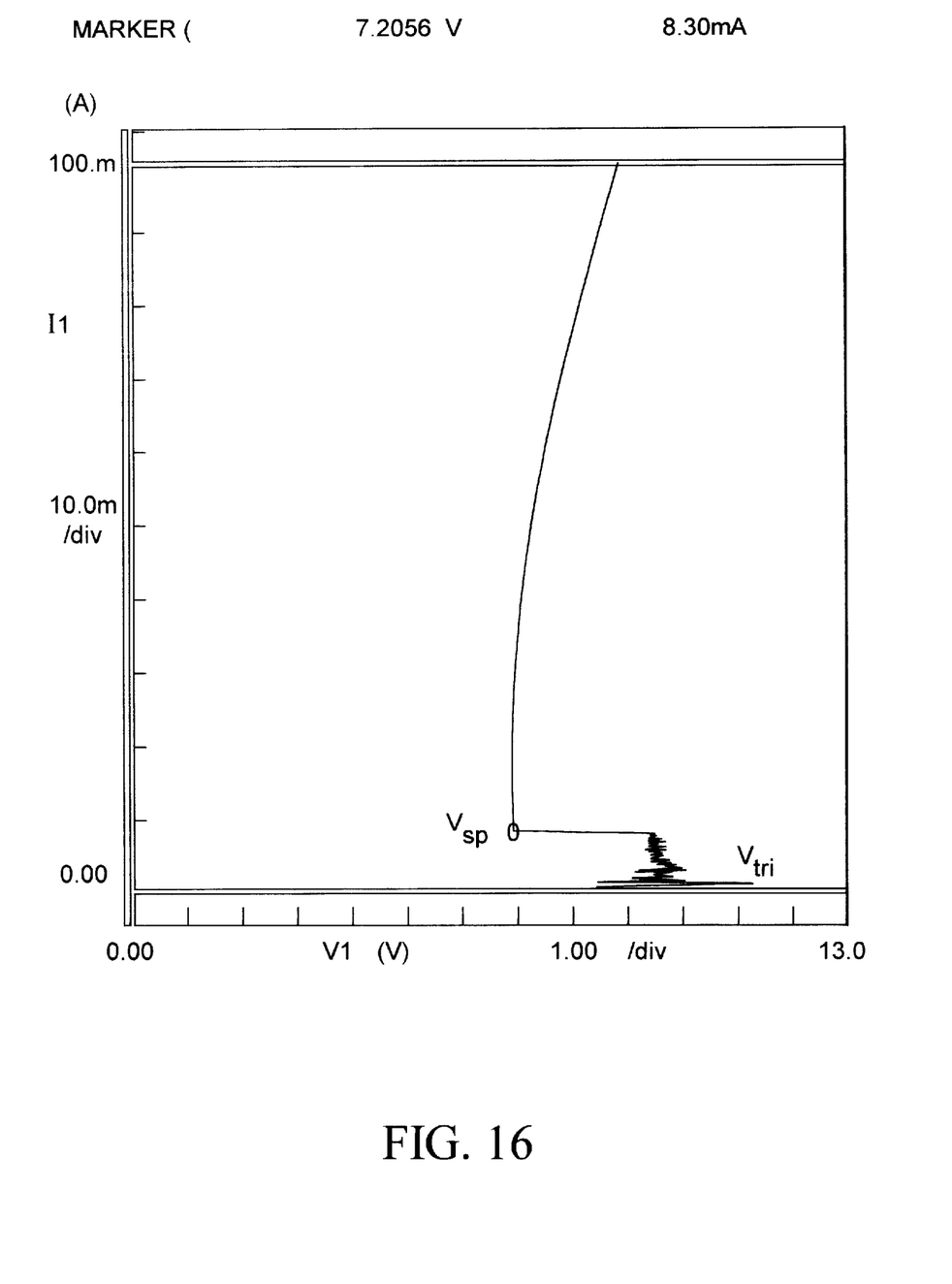
FIG. 16 illustrates the NPN snapback voltage of the non-LDD NMOS device.

FIGS. 15–16 show NPN trigger voltage and snapback voltage of a non-LDD NMOS device, respectively. FIG. 15 shows the parasitic NPN bipolar I-V characteristic of the non-LDD NMOS device. FIG. 15 is focused on the trigger region and Vtri is characterized at approximately 12.1 volts. FIG. 16 also shows the parasitic NPN bipolar I-V characteristic of the non-LDD NMOS device. FIG. 16 is focused on the snapback region and Vsp is characterized at approximately 7.2 volts. FIGS. 15–16 are both measuring the same non-LDD NMOS device.

Figure 17:
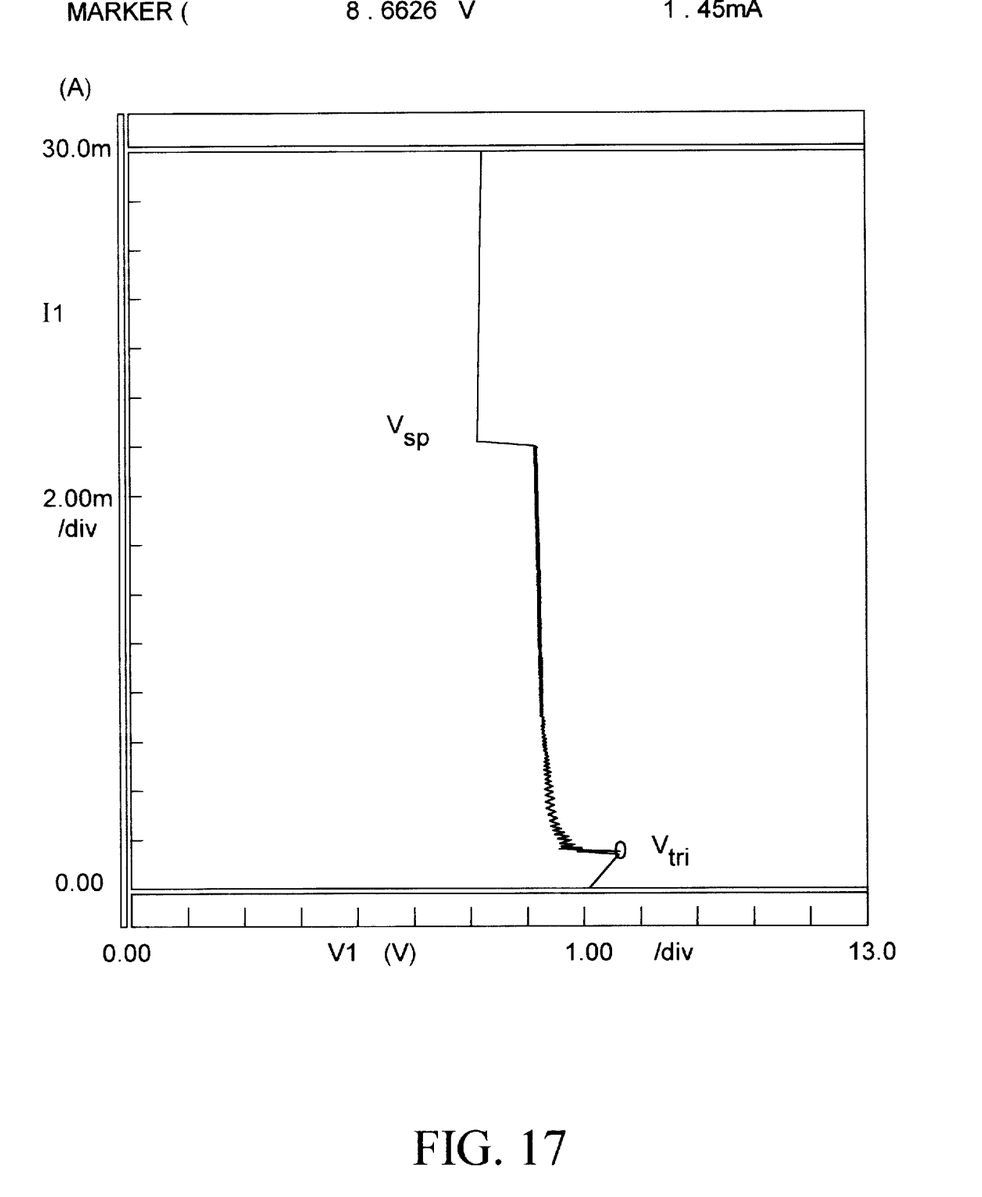
FIG. 17 illustrates the NPN trigger voltage for an LTNMOS device, representing an embodiment of the invention.
Figure 18:
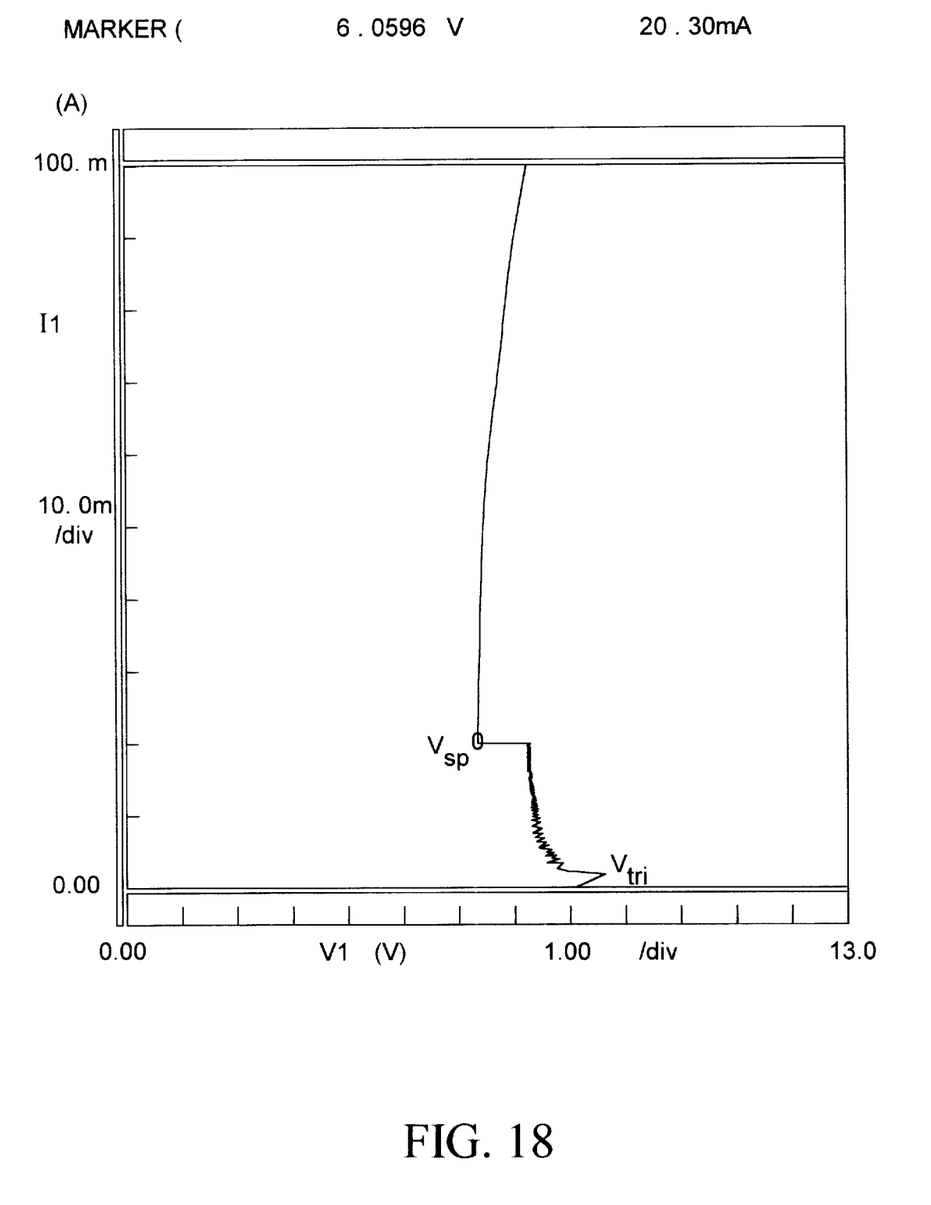
FIG. 18 illustrates the NPN snapback voltage for the LTNMOS device, representing an embodiment of the invention.

FIGS. 17–18 show NPN trigger voltage and snapback voltage for an LTNMOS device representing an embodiment of the invention, respectively. FIG. 17 shows the parasitic NPN bipolar I-V characteristic of the LTNMOS protection device. FIG. 17 is focused on the trigger region and Vtri is characterized at approximately 8.6 volts. FIG. 18 is focused on the snapback region, and Vsp is characterized at approximately 6.0 volts. FIGS. 17–18 are both measuring the same LTNMOS device.

These results are similar to the data described above with regard to FIG. 10. The Vtri 8.6 volt of the LTNMOS in FIG. 17 is lower than the Vtri of 9.4 volt described above with regard to FIG. 10 because of a different P-implant dose and because the data is measured from a different wafer condition. It can be appreciated that a comparision of FIGS. 17–18 with FIGS. 15–16 reveals the significantly improved performance of the invention.

EXAMPLES

Specific embodiments of the invention will now be further described by the following, nonlimiting examples which will serve to illustrate in some detail various features of significance. The examples are intended merely to facilitate an understanding of ways in which the invention may be practiced and to further enable those of skill in the art to practice the invention. Accordingly, the examples should not be construed as limiting the scope of the invention.

EXAMPLE 1

Figure 11:
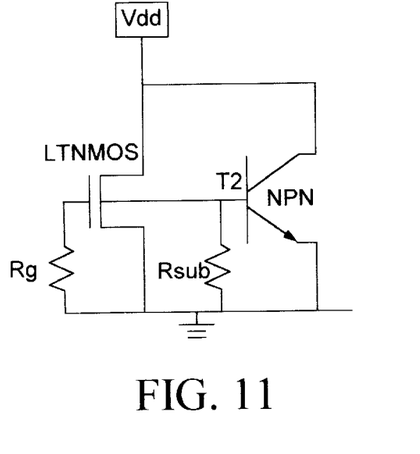
FIG. 11 illustrates a schematic block diagram of a low-voltage triggering N channel metal oxide semiconductor protection circuit in combination with a coupling resistor, representing an embodiment of the invention.

Referring to FIG. 11, a first example of an LTNMOS coupled gate circuit is illustrated. In this embodiment, Vdd will be shunted to ground if Vdd exceeds the Vtri of the LTNMOS. The circuit illustrated in FIG. 11 further lowers the threshold of the trigger voltage (Vtri) by combining a gate coupling resistor Rg with the LTNMOS protection device so as to connect the gate of the LTNMOS protection device to ground through the coupling resistor Rg. In this example, the coupling resistor Rg is a passive component. The coupling resistor Rg can have an impedance of from approximately 1 to 10k ohm and can pull up gate voltage of the LTNMOS protection device so as to lower Vtri during an ESD pulse. The coupling resistor Rg can be an n-well, an n-diffusion path, or any other type of resistor.

EXAMPLE 2

Figure 12:
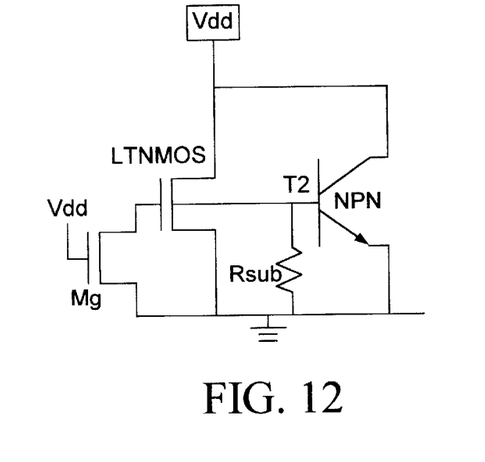
FIG. 12 illustrates a schematic block diagram of a low-voltage triggering N channel metal oxide semiconductor protection circuit in combination with an active metal oxide semiconductor resister, representing an embodiment of the invention.

Referring to FIG. 12, a second example of an LTNMOS coupled gate circuit is illustrated. In this embodiment, Vdd will be also shunted to ground if Vdd exceeds the Vtri of the LTNMOS. The circuit illustrated in FIG. 12 further lowers the threshold of the trigger voltage (Vtri) by combining an MOS device Mg with the LTNMOS protection device by connecting the gate of the LTNMOS protection device to ground through the MOS device Mg. In this example, the coupling resistor Mg is active component.

Although the gate of the LTNMOS in FIGS. 11 and 12 is not directly connected to Vss, the gate voltage level is still equal to Vss (i.e., ground) during normal chip operation (i.e., in the absence of an ESD event, the LTNMOS is in an off state and there is no extra leakage current). In many integrated circuits (IC), the PW (P-substrate) 1030 is connected to Vss. But in some integrated circuits, such as DRAM, the PW is connected to Vbb (from substrate bias generator built into the IC). The Vbb voltage may be from approximately −1.5 v to approximately −3.0 volt. Vbb is a negative bias voltage. Therefore, PW 1030 may not be equal to Vss (i.e., ground).

The gate voltage of the LTNMOS shown in FIG. 10 is equal to Vss during an ESD pulse. But the gate voltage of the LTNMOS in FIG. 11 or FIG. 12 is coupled to a voltage the depends on the gate/drain capacitance Cgd, the gate/source capacitance Cgs, the gate/bulk (PW) capacitance Cgb, and the gate coupling resistor Rg, values during any ESD pulse. For example, when a positive voltage ESD pulse is applied to the drain of an LTNMOS, both the source and the substrate (PW) are at ground; the gate voltage level of the LTNMOS can be pulled up to a positive voltage by RC coupling of the ESD voltage. This RC coupling is defined above in terms of Rg, Cgd, Cgs, and Cgb. A positive gate voltage can lower the trigger voltage of the parasitic NPN bipolar. The LTNMOS in FIGS. 11–12 are configured to achieve this purpose.

EXAMPLE 3

Figure 14:
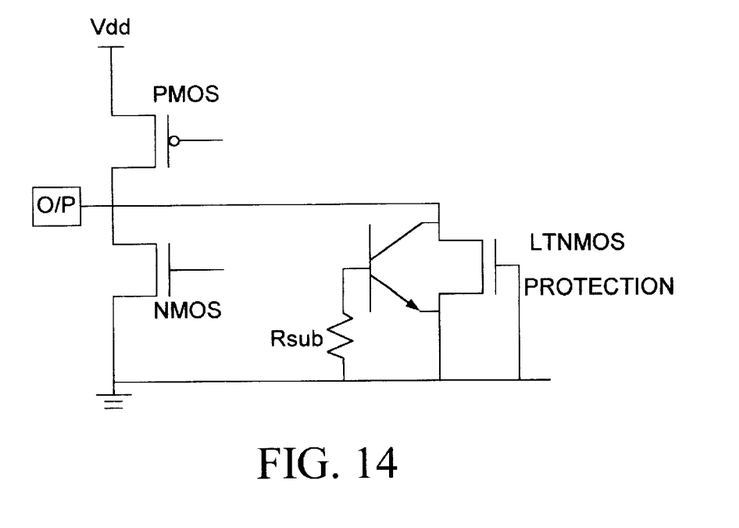
FIG. 14 illustrates a schematic block diagram of a low-voltage triggering N channel metal oxide semiconductor for input/output (I/O) protection, representing an embodiment of the invention.

Referring to FIG. 14, a third example of an LTNMOS coupled gate circuit is illustrated. In this embodiment, the LTNMOS protection device is connected in parallel with an output buffer and provides an extra current discharging path to avoid output device leakage. The LTNMOS is very effective for protecting LDD NMOS of output buffer during an ESD event. In contrast, the non-LDD NMOS (FIG. 4) cannot provide sufficient protection for an output buffer. Further, series resistors and the thick field devices (FIG. 1) used in the prior art to protect output buffer NMOS, have been found to cause leakage of the output buffer NMOS. The LTNMOS of invention can achieve better ESD performance without additional series resistors or degrading output NMOS.

The disclosed embodiments, including three examples discussed above show a conductor (FIGS. 10 and 13–14), a resistor (FIG. 11), and an active MOS resistor (FIG. 12) as the structure for performing the function of coupling the gate to the diode. However, the structure for coupling the gate to the diode can be any other structure capable of performing the function of coupling the gate to the diode, including, by way of example, a diffusion line, a wire, a capacitor, or even an inductor.

Practical Applications of the Invention

A practical application of the invention that has value within the technological arts is in conjunction with Vdd/Vss power buses to protect internal circuits against ESD pulse. Further, the invention is useful in conjunction with input, output, or input/out pins to prevent gate oxide damage and damage to output devices, or the like. There are virtually innumerable uses for the invention, all of which need not be detailed here.

Advantages of the Invention

A low-voltage triggering ESD protection approach, representing an embodiment of the invention, can be cost effective and advantageous for at least the following reasons. The low voltage triggering ESD protection device includes an abrupt junction. The low voltage triggering ESD protection device has both a low trigger voltage (Vtri) and a low snapback voltage (Vsp). The low voltage triggering ESD protection device has a higher ESD performance than LDD NMOS devices. The low voltage triggering ESD protection device does not exhibit any non-uniform current problems (i.e., hot spots) during an ESD pulse. Methods of making the low voltage triggering ESD protection device are compatible with CMOS processes. The high ESD protection performance provided by the invention can be achieved with embodiments fabricated in accordance with advanced CMOS processes. For example, the method of making the invention is compatible with the process steps used to make lightly doped drain (LDD) NMOS made by the self aligned silicide (salicide) process.

All the disclosed embodiments of the invention described herein can be realized and practiced without undue experimentation. Although the best mode of carrying out the invention contemplated by the inventors is disclosed above, practice of the invention is not limited thereto. Accordingly, it will be appreciated by those skilled in the art that the invention may be practiced otherwise than as specifically described herein.

For example, the individual components need not be formed in the disclosed shapes, or assembled in the disclosed configuration, but could be provided in virtually any shape, and assembled in virtually any configuration. Further, the individual components need not be fabricated from the disclosed materials, but could be fabricated from virtually any suitable materials. Further, although the electrostatic discharge device is described herein as a physically separate module, it will be manifest that the electrostatic discharge device may be integrated into the apparatus with which it is associated. Furthermore, all the disclosed elements and features of each disclosed embodiment can be combined with, or substituted for, the disclosed elements and features of every other disclosed embodiment except where such elements or features are mutually exclusive.

It will be manifest that various additions, modifications and rearrangements of the features of the invention may be made without deviating from the spirit and scope of the underlying inventive concept. It is intended that the scope of the invention as defined by the appended claims and their equivalents cover all such additions, modifications, and rearrangements. The appended claims are not to be interpreted as including means-plus-function limitations, unless such a limitation is explicitly recited in a given claim using the phrase "means-for." Expedient embodiments of the invention are differentiated by the appended subclaims.

What is claimed is:

1. An electrostatic discharge protection circuit for protected terminals on an integrated circuit substrate, the integrated circuit substrate having a first conductivity type, the electrostatic discharge protection circuit comprising:

a source located in the integrated circuit substrate, the source having a second conductivity type;

a drain located in the integrated circuit substrate, the drain having the second conductivity type;

a channel located between the source and the drain;

a first lightly doped region located in the channel and between the source and the drain, the first lightly doped region having the first conductivity type;

a first electrical contact on the source; and a second electrical contact on the drain, wherein the first electrical contact and the second electrical contact are coupled to protected terminals on the integrated circuit substrate.

2. The electrostatic discharge protection circuit of claim 1, wherein the first lightly doped region and the drain are adjacent to each other and define a first diode.

3. The electrostatic discharge protection circuit of claim 1, further comprising a gate structure located over both the channel and the first lightly doped region.

4. The electrostatic discharge protection circuit of claim 3, wherein the gate structure is electronically coupled to ground so as to define a parasitic bipolar transistor.

5. The electrostatic discharge protection circuit of claim 4, further comprising a region located in the integrated circuit substrate, the region having the first conductivity type, and wherein the gate structure is electronically coupled to ground.

6. The electrostatic discharge protection circuit of claim 5, wherein the gate structure is electronically coupled to ground with a passive resistor.

7. The electrostatic discharge protection circuit of claim 5, wherein the gate structure is electronically coupled to ground with an active resistor.

8. The electrostatic discharge protection circuit of claim 1, wherein the source is electronically coupled to ground.

9. The electrostatic discharge protection circuit of claim 1, wherein the drain is electronically coupled to an input bus.

10. The electrostatic discharge protection circuit of claim 1, wherein the drain is electronically coupled to an output bus.

11. The electrostatic discharge protection circuit of claim 1, wherein the drain is electronically coupled to an input/output bus.

12. The electrostatic discharge protection circuit of claim 1, wherein the drain is electronically coupled to a power rail.

13. The electrostatic discharge protection circuit of claim 1, wherein the protected terminals compose a power supply input terminal.

14. The electrostatic discharge protection circuit of claim 1, wherein the protected terminals compose a data signal input terminal.

15. The electrostatic discharge protection circuit of claim 2, further comprising a second lightly doped region located in the channel and between the first lightly doped region and the source, the second lightly doped region having the first conductivity type.

16. The electrostatic discharge protection circuit of claim 15, wherein the second lightly doped region and the source are adjacent and define a second diode.

17. The electrostatic discharge protection circuit of claim 1, wherein the first lightly doped region defines an implanted channel.

18. The electrostatic discharge protection circuit of claim 1, wherein the first conductivity type is p type and the second conductivity type is n type.

19. The electrostatic discharge protection circuit of claim 1, wherein both the first electrical contact and the second electrical contact include silicide.

20. An integrated circuit on a substrate having a first conductivity type and a plurality of terminals, the integrated circuit comprising:
   a plurality of circuits including MOS transistors on the substrate, the plurality of circuits being coupled to the plurality of terminals; and
   an electrostatic discharge protection circuit coupled to a set of protected terminals that compose the plurality of terminals, the electrostatic discharge protection circuit including:
      a source located in the integrated circuit substrate, the source having a second conductivity type;
      a drain located in the integrated circuit substrate, the drain having the second conductivity type;
      a channel located between the source and the drain;
      a first lightly doped region located in the channel and between the source and the drain, the first lightly doped region having the first conductivity type;
      a gate structure located over both the channel and the first lightly doped region, the gate structure being electronically coupled to the substrate so as to define a parasitic bipolar transistor;
      a first electrical contact on the source; and
      a second electrical contact on the drain,
      wherein the first electrical contact and the second electrical contact are coupled to the set of protected terminals.

21. The integrated circuit of claim 20, further comprising a region located in the integrated circuit substrate, the region having the first conductivity type, and wherein the gate structure is electronically coupled to ground.

22. The integrated circuit of claim 21, wherein the gate structure is electronically coupled to ground with a passive resistor.

23. The integrated circuit of claim 21, wherein the gate structure is electronically coupled to ground with an active resistor.

24. The integrated circuit of claim 20, wherein the source is electronically coupled to ground.

25. The integrated circuit of claim 20, wherein the drain is electronically coupled to an input bus.

26. The integrated circuit of claim 20, wherein the drain is electronically coupled to an output bus.

27. The integrated circuit of claim 20, wherein the drain is electronically coupled to an input/output bus.

28. The integrated circuit of claim 20, wherein the drain is electronically coupled to a power rail.

29. The integrated circuit of claim 20, wherein the protected terminals compose a power supply input terminal.

30. The integrated circuit of claim 20, wherein the protected terminals compose a data signal input terminal.

31. The integrated circuit of claim 20, wherein the first lightly doped region and the drain are adjacent to each other and define a first diode.

32. The integrated circuit of claim 31, further comprising a second lightly doped region located in the channel and between the first lightly doped region and the source, the second lightly doped region having the first conductivity type.

33. The integrated circuit of claim 32, wherein the second lightly doped region and the source are adjacent and define a second diode.

34. The integrated circuit of claim 20, wherein the first lightly doped region defines an implanted channel.

35. The integrated circuit of claim 20, wherein the first conductivity type is p type and the second conductivity type is n type.

36. The integrated circuit of claim 20, wherein both the first electrical contact and the second electrical contact include silicide.

37. A method of making an integrated circuit electrostatic discharge protection circuit on a semiconductor substrate having a first conductivity type and a first dopant concentration level, the method comprising:
   forming a gate on the semiconductor substrate;
   forming a first doped region of the first conductivity type in the semiconductor substrate and a second doped region of the first conductivity type in the semiconductor substrate, the first doped region and the second doped region being located proximate the gate and being spaced away from one another by a channel region in the semiconductor substrate, the channel region being located under the gate; and
   forming a third doped region of a second conductivity type in the first doped region and a fourth doped region of the second conductivity type in the second doped region, the third doped region and the fourth doped region being spaced away from one another by a distance that is greater than the distance between the first doped region and the second doped region,
   wherein the doping concentration level of both the first doped region and the second doped region is greater than the doping concentration level of the semiconductor substrate.

38. The method of claim 37, further comprising, after forming the first doped region and the second doped region, and before forming the third doped region and the fourth doped region, forming i) a first spacer adjacent a first side of the gate and over the first doped region, and ii) a second spacer adjacent a second side of the gate and over the second doped region.

39. The method of claim 38, further comprising, after forming the third doped region and the fourth doped region, forming contacts on the third region and the fourth region.

40. The method of claim 39, wherein forming contacts includes forming silicide on the third doped region and the fourth doped region, the silicide being aligned by the first and second spacers.

41. The method of claim 37, further comprising, after forming the gate, and before forming the first doped region and the second doped region,
- masking a first portion of the substrate in which the first doped region and the second doped region will be formed, and
- implanting a second portion of the substrate with carriers of the second conductivity type as part of forming MOS transistors in the second portion of the substrate.

42. The method of claim 37, wherein forming the first doped region and the second doped region includes, after implanting the second portion of the substrate,
- masking the second portion of the substrate; and
- implanting the first portion of the substrate with carrier of the first conductivity type.

43. The method of claim 37, further comprising, after forming the third doped region and the fourth doped region, coupling the gate to a diode formed by a junction between the first doped region and the third doped region.

44. The method of claim 43, wherein coupling includes forming a region in the semiconductor substrate, the region being of the first conductivity type, and connecting the region to the gate.

45. The method of claim 44, wherein connecting the region to the gate includes connecting the gate to ground with a passive resistor.

46. The method of claim 44, wherein connecting the region to the gate includes connecting the gate to ground with an active resistor.

47. The method of claim 37, wherein the first conductivity type is p-type, and the second conductivity is n-type.

48. A method of providing an integrated circuit on a substrate with electrostatic discharge protection, the substrate having a first conductivity type and a first doping concentration level, the method comprising:
- conducting an electrostatic discharge pulse to a drain of an electrostatic discharge protection device that is provided in a nonconductive state; and
- switching the electrostatic discharge protection device to a conductive state so as to provide a lower resistance, substantially uniform current density path for an electrostatic discharge current, thereby shunting substantially all of the electrostatic discharge pulse,
- wherein switching includes
  - routing the electrostatic discharge pulse through a first region of a second conductivity type,
  - then routing the electrostatic discharge pulse through a second region of the first conductivity type, the second region having a doping concentration level that is higher than the first doping concentration level, and
  - then routing the electrostatic discharge pulse through a third region of the second conductivity type.

49. The method of claim 48, further comprising, after routing the electrostatic discharge pulse through the second region and before routing the electrostatic discharge pulse through the third region, routing the electrostatic discharge pulse through a fourth region of the first conductivity type.

50. The method of claim 48, wherein the first region includes a drain and the electrostatic discharge protection device includes a gate located above and between the second region and the third region, and, further comprising applying an electric field between the drain and gate.

51. The method of claim 50, wherein the electric field is derived parasitically as the electrostatic discharge impulse is routed across ajunction defined by an interface between the first region and the second region.

* * * * *